(12) United States Patent
Winter

(10) Patent No.: US 9,450,606 B1
(45) Date of Patent: Sep. 20, 2016

(54) DATA MATCHING FOR HARDWARE DATA COMPRESSION

(71) Applicant: Seagate Technology LLC, Cupertino, CA (US)

(72) Inventor: Howard William Winter, Romsey (GB)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/873,151

(22) Filed: Oct. 1, 2015

(51) Int. Cl.
 *H03M 7/38* (2006.01)
 *H03M 7/30* (2006.01)
 *H03M 7/40* (2006.01)

(52) U.S. Cl.
 CPC ............. *H03M 7/3084* (2013.01); *H03M 7/30* (2013.01); *H03M 7/40* (2013.01)

(58) Field of Classification Search
 CPC ...... H03M 7/30; H03M 7/40; G01B 20/1426
 USPC .................... 341/51, 87, 67, 95, 106; 382/56
 See application file for complete search history.

(56) References Cited

U.S. PATENT DOCUMENTS

| | | | |
|---|---|---|---|
| 517,937 | A | 4/1894 | Schulze |
| 679,883 | A | 8/1901 | Burger |
| 5,003,307 | A | 3/1991 | Whiting et al. |
| 5,051,745 | A | 9/1991 | Katz |
| 5,473,326 | A | 12/1995 | Harrington et al. |
| 5,525,982 | A | 6/1996 | Cheng et al. |
| 5,532,693 | A | 7/1996 | Winters et al. |
| 5,572,209 | A | 11/1996 | Farmer et al. |
| 5,602,764 | A | 2/1997 | Eskandari-Gharnin et al. |
| 5,612,693 | A | 3/1997 | Craft et al. |
| 5,771,010 | A | 6/1998 | Masenas |
| 5,874,908 | A * | 2/1999 | Craft ....................... G06T 9/005 341/87 |
| 5,903,230 | A | 5/1999 | Masenas |
| 5,929,791 | A | 7/1999 | Masenas |
| 6,693,567 | B2 | 2/2004 | Cockburn et al. |
| 7,233,265 | B2 | 6/2007 | Cockburn et al. |
| 2014/0114937 | A1 | 4/2014 | Chen |

FOREIGN PATENT DOCUMENTS

CN 101489128 7/2009

* cited by examiner

*Primary Examiner* — Joseph Lauture
(74) *Attorney, Agent, or Firm* — Taylor English Duma LLP

(57) ABSTRACT

Methods and apparatuses for generating match data for a symbol in a symbol history for use in a hardware-based data compressor. An apparatus for performing history matching for Lempel-Ziv ("LZ") compression includes a symbol history RAM comprising $2^S$ N bit entries, each entry corresponding to a symbol value represented by S bits and indicating locations within the last N symbols of input data where the symbol value occurred; a symbol counter array comprising $2^S$ counters, each counter corresponding to a symbol value and indicating a number of symbols processed since the last occurrence of the symbol value in the input data; and a barrel shifter configured to shift the entry corresponding to an input symbol value left by a number of bits based on a value of the counter corresponding to the input symbol value to produce a symbol match vector for the input symbol.

20 Claims, 6 Drawing Sheets

DATA MATCHING FOR HARDWARE DATA COMPRESSION

BRIEF SUMMARY

The present disclosure relates to methods and apparatuses for generating match data for a symbol in a symbol history for use in a hardware-based data compressor. According to some embodiments, an apparatus for performing history matching for a Lempel-Ziv ("LZ") compression scheme includes a symbol history random access memory ("RAM") comprising $2^S$ N bit entries, each entry corresponding to a unique symbol value represented by S bits and indicating locations within the last N symbols of input data where the unique symbol value occurred. The apparatus further includes a symbol counter array comprising $2^S$ counters, each counter corresponding to a unique symbol value and indicating the number of symbols processed since the last occurrence of the unique symbol value in the input data. The apparatus further includes a barrel shifter configured to shift the entry corresponding to an input symbol value left by a number of bits based on the value of the counter corresponding to the input symbol value from the symbol counter array to produce a symbol match vector for the input symbol.

According to further embodiments, a method of producing symbol matches from a symbol history RAM for an input symbol comprises receiving the input symbol from an input data stream and reading an entry from the symbol history RAM corresponding to the input symbol value. The entry comprises N bits indicating locations within the last N symbols from the input data stream where the input symbol value occurred. The entry is shifted left a number of bits based on a value of a counter corresponding to the input symbol value to produce a symbol match vector for the input symbol, the value of the counter indicating a number of symbols processed since the last occurrence of the input symbol value in the input data stream.

According to further embodiments, a system comprises an encoder configured to compress an input data stream based on an a Lempel-Ziv ("LZ") compression scheme, pattern tracking logic configured to determine the location and length of matching sequences in symbol history based on symbol match vectors for each symbol in the input data stream, and history matching logic. The history matching logic is configured to receive an input symbol from the input data stream and read an entry from a symbol history RAM corresponding to the input symbol value. The entry comprises N bits indicating locations within the last N symbols from the input data stream where the input symbol value occurred. The entry is shifted left a number of bits based on the value of a counter corresponding to the input symbol value to produce a symbol match vector for the input symbol.

These and other features and aspects of the various embodiments will become apparent upon reading the following Detailed Description and reviewing the accompanying drawings.

BRIEF DESCRIPTION OF THE DRAWINGS

In the following Detailed Description, references are made to the accompanying drawings that form a part hereof, and that show, by way of illustration, specific embodiments or examples. The drawings herein are not drawn to scale. Like numerals represent like elements throughout the several figures.

DETAILED DESCRIPTION

The following detailed description is directed to methods and apparatuses for generating match data for a symbol in a symbol history for use in a hardware-based data compressor. Some data compressors utilize a class of algorithms that compress data by replacing portions of the data with references to matching data that has already occurred in the input data. For example, Lempel-Ziv ("LZ") algorithms achieve lossless compression by replacing portions of the input data with references to matching data that has already passed through the encoder. A match is encoded into the output (compressed) data stream by a pair of numbers called a length-offset pair indicating that the next characters (also referred to herein as "symbols") in the data are equal to the length characters that occurred offset characters behind it in the input (uncompressed) stream. LZ compression algorithms support the implementation of high-rate, hardware-based compression engines, such as those used in controllers for hard disk drive ("HDD") devices, solid-state disk ("SSD") devices, or other mass storage devices; network interface controllers ("NICs"), or other digital communication devices; and the like.

Figure 1:
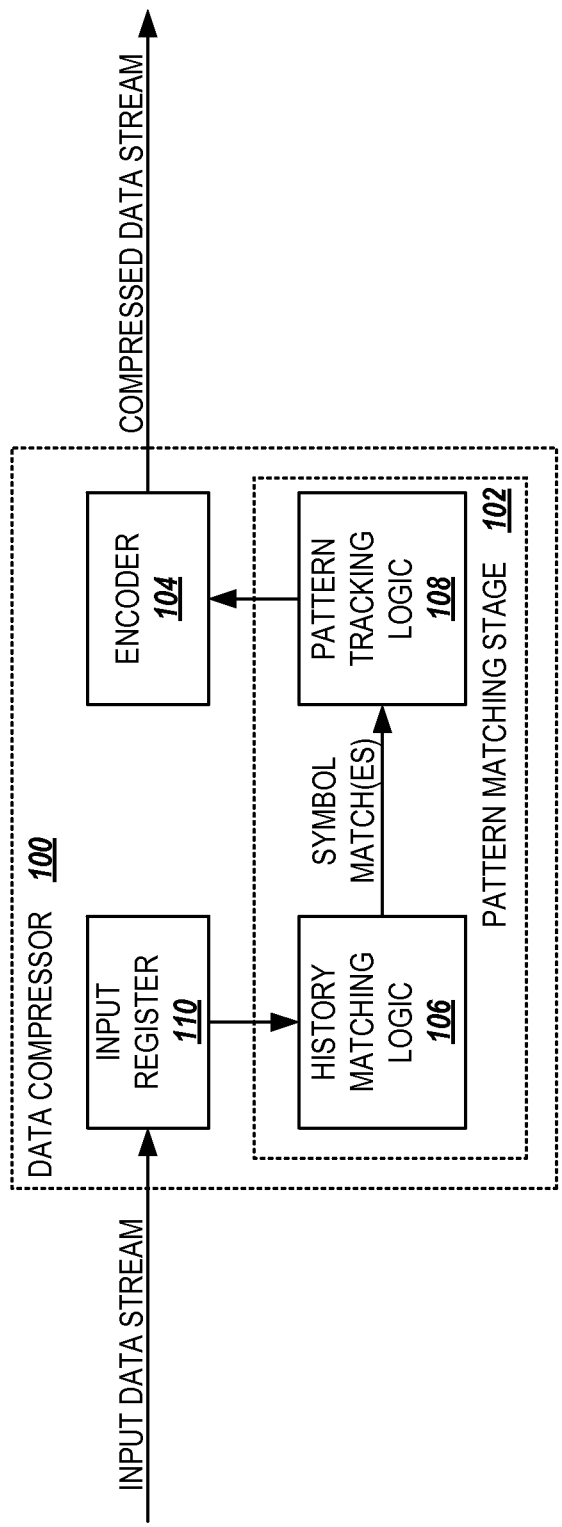
FIG. 1 is a block diagram showing a data compressor system that utilizes an apparatus for generating match data for a symbol in a symbol history, according to embodiments described herein.

FIG. 1 provides an overview of an illustrative data compressor 100 that may implement an LZ compression algorithm, according to embodiments. The data compressor 100 generally includes a pattern matching stage 102 and an encoder 104. The pattern matching stage 102 tracks reoccurring patterns in the input data stream and provides the data to the encoder 104 for encoding in the compressed data (output) stream. The methodologies used to implement the pattern matching stage 102 and the encoder 104 may be independent. For example, particular implementations may combine different pattern matching stages 102 with different encoders 104, such as Huffman encoding, arithmetic coding, or the like. Some solutions may utilize a fixed pattern matching stage 102 but adapt the encoding based on the contents or character of the input data.

The pattern matching stage 102 may include history matching logic 106 for finding matches for each input symbol in a symbol history and pattern tracking logic 108 for determining the length and location of strings of symbols or "runs" that reoccur in the input data. In some embodiments, the history matching logic 106 may receive each input symbol from an input register 110, and determine whether the symbol has occurred previously in the input data from the symbol history. The locations of any matches for the symbol in the symbol history are then passed to the pattern tracking logic 108. According to some embodiments, the encoder 104, history matching logic 106, pattern tracking logic 108, and input register 110 are all implemented in hardware to support hardware-based data compressors 100 for high-rate compression of data in real-time.

A number of hardware-based solutions for symbol history matching exist, including utilizing a series or string of shift registers and comparators to search symbol history or utilizing content-addressable memory ("CAM"). However, CAM-based implementations are typically only possible with a full-custom application specific integrated circuit ("ASIC") design. In addition, shift register-based designs may use excessive power and/or may not be very efficient for field-programmable gate arrays ("FPGAs") or semi-custom structured ASICs. Small random-access memories ("RAMs") are prevalent in such devices, and some FPGAs can also construct distributed RAMs from the logic cells. However CAM and shift-register-based solutions generally cannot make use of these RAM blocks and therefore map poorly to these architectures.

Utilizing the embodiments provided herein, hardware-based history matching logic 106 may be implemented that doesn't require the use of CAM or large numbers of shift registers. History matching logic 106 implemented according to the embodiments described herein returns an N bit symbol match vector indicating where an input symbol has occurred in the last N symbols of the input stream in a single clock cycle (i.e., substantially one symbol per clock with some fixed, static delay between the various stages). The history matching logic 106 is scalable in terms of history buffer size and symbol width. In some embodiments, the history matching logic is also scalable in fundamental performance in terms of bytes-per-clock cycle. It may also have lower power consumption and a lower gate/logic count than conventional designs, especially compared to shift register implementations where bit flips between subsequent symbols have a large impact (on power). In addition, the use of RAMs and a barrel shifter as described below may make for a more optimal resource fit for programmable and non-full-custom logic devices, such as FPGAs and structured ASICs.

Figure 2:
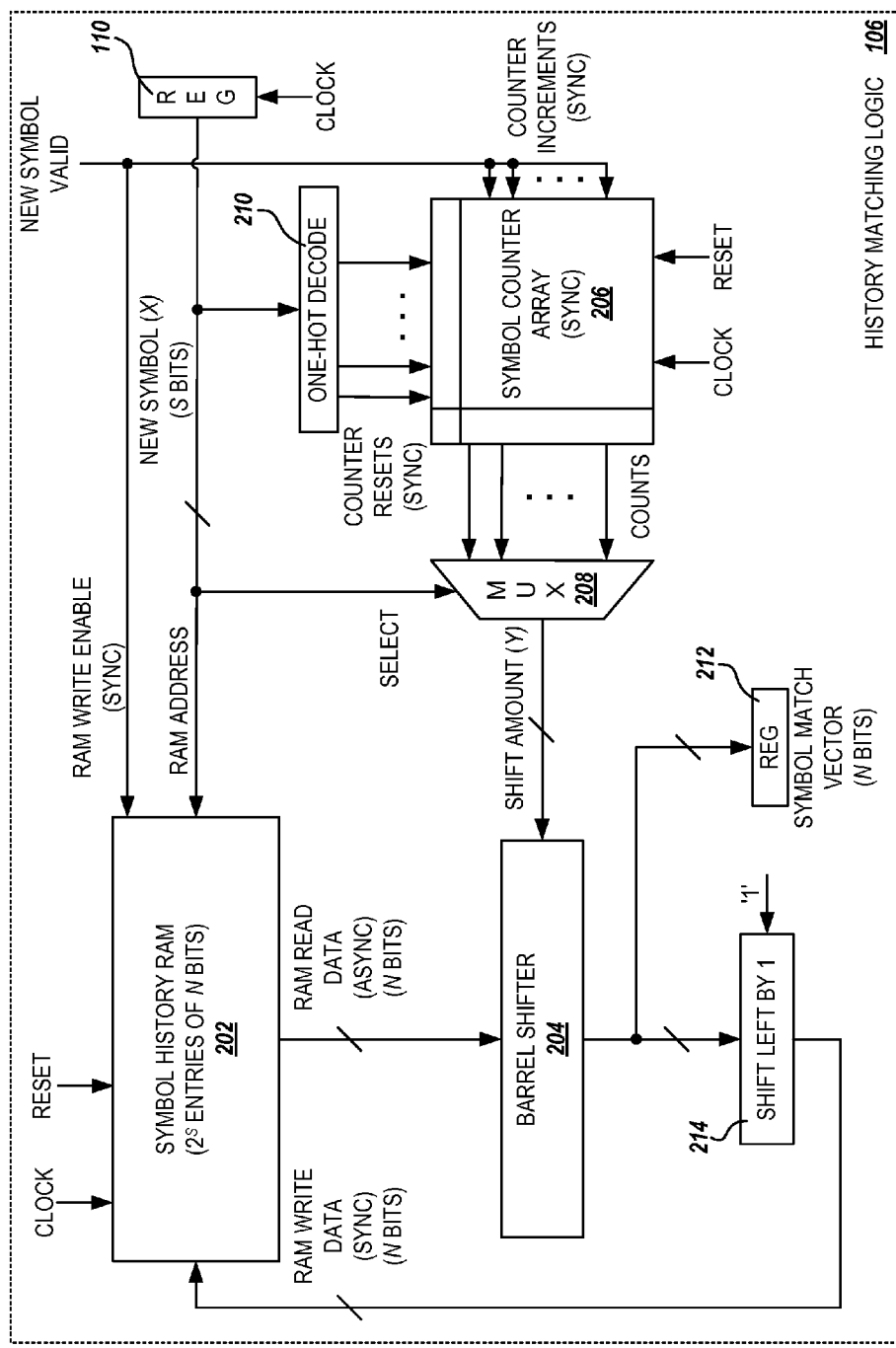
FIG. 2 is a logic diagram showing illustrative logic for generating match data for a symbol in a symbol history, according to embodiments described herein.

FIG. 2 shows one possible implementation of history matching logic 106 for use in a hardware-based data compressor 100, according to some embodiments. According to embodiments, the history matching logic 106 processes matches for each new symbol of S bits in the input register 110. In some embodiments, the history matching logic 106 comprises a symbol history RAM 202, a barrel shifter 204, and a symbol counter array 206. The symbol counter array 206 consists of $2^S$ counters (e.g., 256 counters for 8 bit wide symbols), each of size log 2 N bits. The value of each counter represents the number of new symbols processed since the corresponding symbol appeared in the input data stream.

The new symbol X from the input register 110 selects the corresponding counter value Y from the symbol counter array 206 via a counter selection multiplexer ("MUX") 208 to be used by the barrel shifter 204, as described below. In addition, the new input symbol X causes the corresponding symbol counter to be reset to zero via a one-hot decoder 210, while the remaining counters are incremented by one for each new symbol processed. In some embodiments, the counters in the symbol counter array 206 do not wrap but stick at the maximum value of N-1. This ensures that when symbols are separated by more than N symbols in the symbol history, any matches stored in the symbol history RAM 202 are shifted completely out of scope and false matches are avoided. In further embodiments, the counters of the symbol counter array 206 are reset to zero when the history matching logic 106 is initialized for each new block of data.

The symbol history RAM 202 stores an N bit value for each possible symbol value, each bit representing the occurrence of that symbol value in the N previous symbols in the input stream. For example, for S=8 bit symbols, the size of the symbol history RAM 202 would be 256×N bits. The symbol history RAM 202 is addressed by the symbol value X and returns a symbol match vector of size N bits corresponding to the symbol. In addition, an updated symbol match vector is written back to the symbol history RAM 202 for the symbol value X after a fixed shift left of one bit. This shift introduces a '1' at the lowest bit position to represent the current symbol X in the input stream for the next time the corresponding symbol match vector is required. In some embodiments, reads from the symbol history RAM 202 are asynchronous while writes are synchronous with respect to the clock.

In order to ensure data from previous runs of the data compressor 100 are ignored, several methods may be implemented to initialize the symbol history RAM 202 for each new block of data. For example, the counters of the symbol counter array 206 may be reset to the maximum value (N-1) to ensure that the RAM contents are shifted entirely out and ignored on the first use of any symbol. In other embodiments, if the underlying device technology (FPGA, ASIC, etc.) supports it, a global reset of the symbol history RAM 202 may be used to force the contents to zero before each new block of data. In further embodiments, the contents of the symbol history RAM 202 may be initialized to zero before each block of data is compressed by counting through each symbol and forcing the corresponding entry to zero. Alternatively or additionally, an N bit RAM valid register may be utilized to validate the bits of the symbol match vectors read from the symbol history RAM 202. This register is reset to zero before each new block of data.

According to embodiments, the symbol match vector corresponding to the current symbol X is retrieved from the symbol history RAM 202 and shifted by the corresponding counter value Y by the barrel shifter 204. The counter value Y is selected from the symbol counter array 206 by the counter selection MUX 208 with the symbol value X as selection input. Shifting the symbol match vector by Y causes zeros to be shifted into the lower bit positions, and the shifted N bit value represents the locations in the history of input data where the symbol X previously occurred. The symbol match vector is sent to an output register 212 to be processed by the pattern tracking logic 108, according to some embodiments. In addition, the symbol match vector is written back to the symbol history RAM 202 after an additional shift left by one bit, as described above, and the corresponding symbol counter is reset. The symbol match vector may be shifted left by one bit while introducing a '1' at the lowest bit position by a shift register 214, according to some embodiments.

Figure 3:
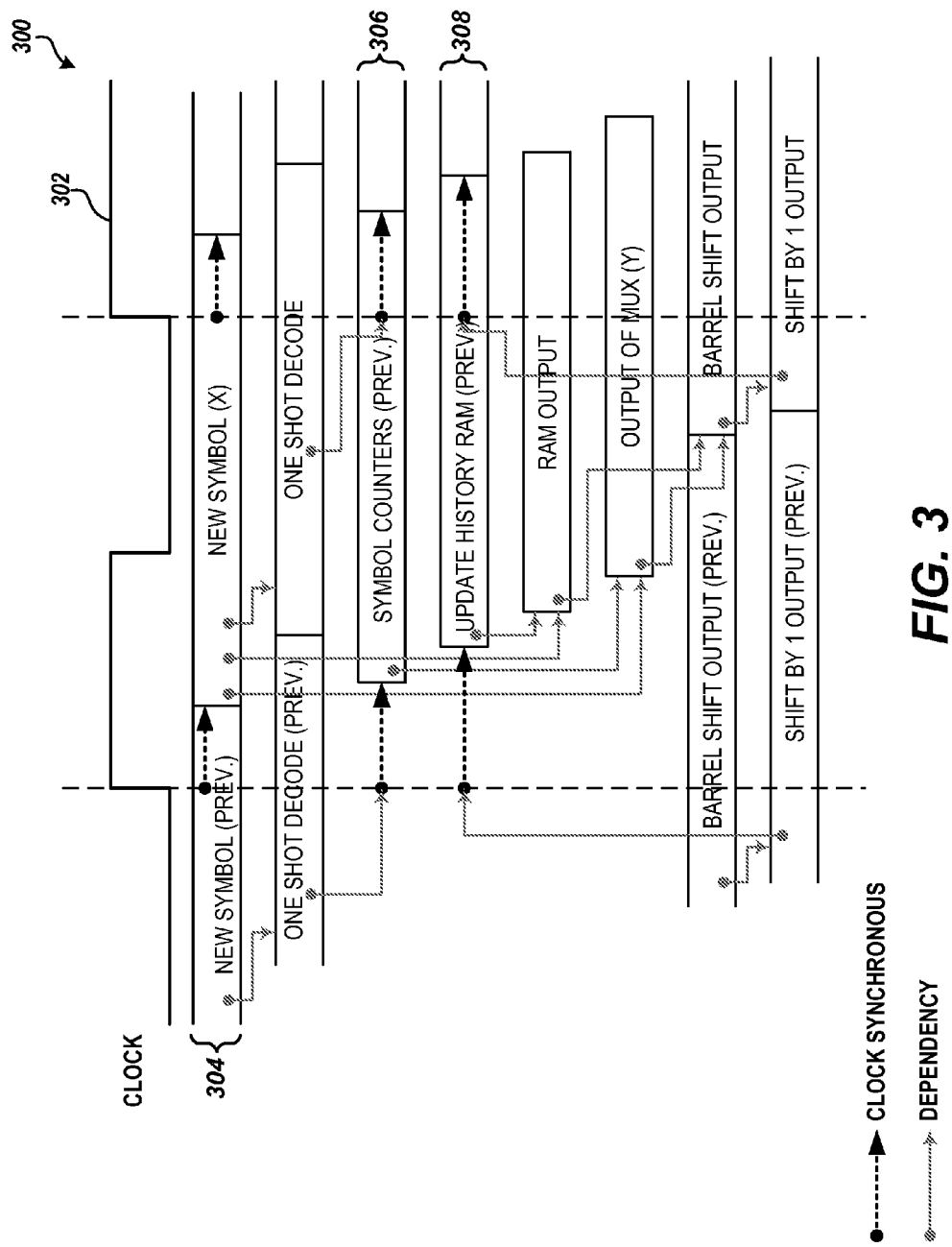
FIG. 3 is a timing diagram showing additional details of the operation of the logic for generating match data for a symbol in a symbol history, according to embodiments described herein.

As indicated in FIG. 2, the writing of the shifted symbol match vector back to the symbol history RAM 202 and the increment/reset of the counters in the symbol counter array 206, as well as the presentation of the new symbol X in the input register 110, may be performed in a synchronous fashion with respect to an input clock. FIG. 3 shows a timing diagram 300 that provides further details regarding the timing of the operations in the history matching logic 106 shown in FIG. 2, according to some embodiments. As may be seen in the timing diagram 300, the presentation of the new symbol (shown at 304), the increment/reset of the counters (shown at 306), and the write back of the symbol match vector to the RAM (shown at 308) are performed synchronous to the rising edge of the clock signal 302. In addition, the increment/reset of the counters 306 and the write back of the symbol match vector to the RAM 308 corresponding with a particular input symbol X may be performed in the following clock cycle, according to further embodiments.

Figure 4:
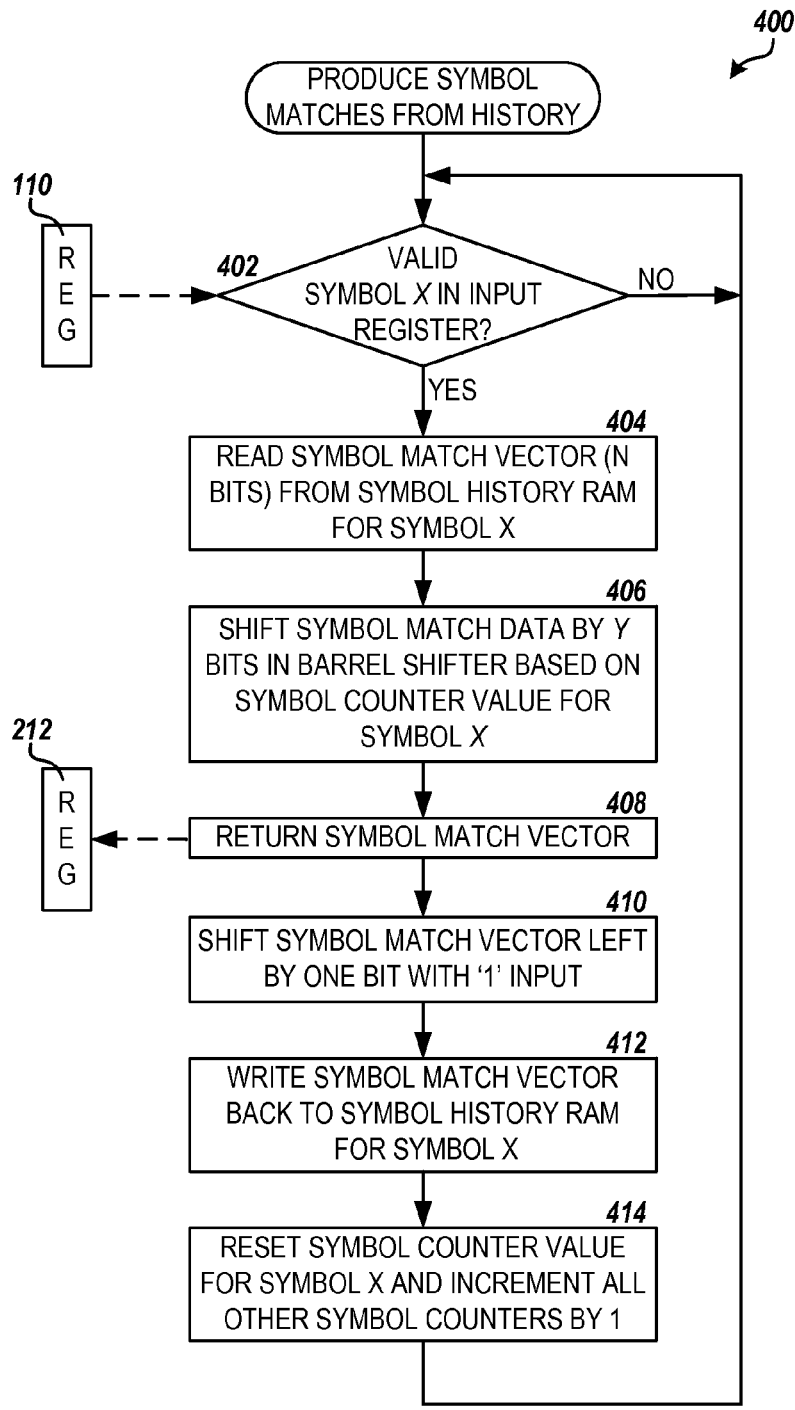
FIG. 4 is a flow diagram showing one routine for generating match data for a symbol in a symbol history, according to embodiments described herein.

FIG. 4 illustrates one routine 400 for producing the symbol matches from the symbol history RAM 202 for an input symbol X, according to some embodiments. According to some embodiments, the routine 400 may be performed by the history matching logic 106 of a hardware-based data compressor 100, such as the history matching logic described herein in regards to FIGS. 2 and 3. In further embodiments, the routine 400 may be performed by a programmable digital controller, a microcontroller, an FPGA, an ASIC, a processor, or a combination of these and/or other digital components and circuitry implemented in a data compressor 100. It will be appreciated that the steps 402-414 depicted in the routine 400 may be implemented entirely in hardware and may be performed substantially in parallel in a single clock cycle with some fixed, static delays between components/stages. As such, the order of the steps depicted in FIG. 4 is not meant to be limiting, and was selected for convenience of description.

The routine 400 begins at step 402, where the history matching logic 106 waits for a valid, new symbol X from the input stream to arrive in the input register 110. Once the new symbol X is in the input register 110, the routine 400 proceeds to step 404, where the symbol match vector corresponding to the symbol X is read from the symbol history RAM 202. The symbol match vector may be retrieved by using the symbol X value to address the N bit entry in the symbol history RAM 202. According to some embodiments, the read from the symbol history RAM 202 is performed asynchronously.

The routine proceeds from step 404 to step 406, where the N bit symbol match vector is passed to the barrel shifter 204, which shifts the match vector value left by Y bits. The value Y is provided by the symbol counter corresponding to the symbol value X in the symbol counter array 206. The value of Y represents the number of new symbols processed since the symbol X last appeared in the input data stream. In some embodiments, the symbol counter corresponding to the value X is selected from the symbol counter array 206 by the counter selection MUX 208, as shown in FIGS. 2 and 3.

From step 406, the routine 400 proceeds to step 408, where the shifted symbol match vector is provided to the downstream logic of the data compressor 100. For example, the symbol match vector may be placed in an output register 212 and provided to the pattern tracking logic 108. The N bit symbol match vector contains a 1 in each bit corresponding to the occurrence of the value X in the last N symbols in the input data stream. The pattern tracking logic 108 may process the symbol match vectors from consecutive symbols in the input stream to determine the location and length of any matching sequences in symbol history and provide the information to the encoder 104 for encoding of the compressed data stream.

Next, the routine 400 proceeds to step 410, where the symbol match vector is further shifted left by one bit with a '1' introduced at the lowest bit position. This updates the symbol match vector to indicate the current symbol X in the input stream for the next time the symbol match vector is required. The updated symbol match vector is then written back to the symbol history RAM 202 for the symbol value X. In some embodiments, the updated symbol match vector is written to the symbol history RAM 202 synchronously with respect to the clock signal 302. Additionally, the symbol counter corresponding to the symbol value X in the symbol counter array 20 is reset to zero, while the value of the remaining symbol counters are incremented by one, as shown at step 414. This is also done synchronously with respect to the clock signal 302 in order for the changes to the counters to be ready for the next input symbol. The routine 400 then returns to step 402 to wait for next new symbol X from the input data stream.

Figure 5:
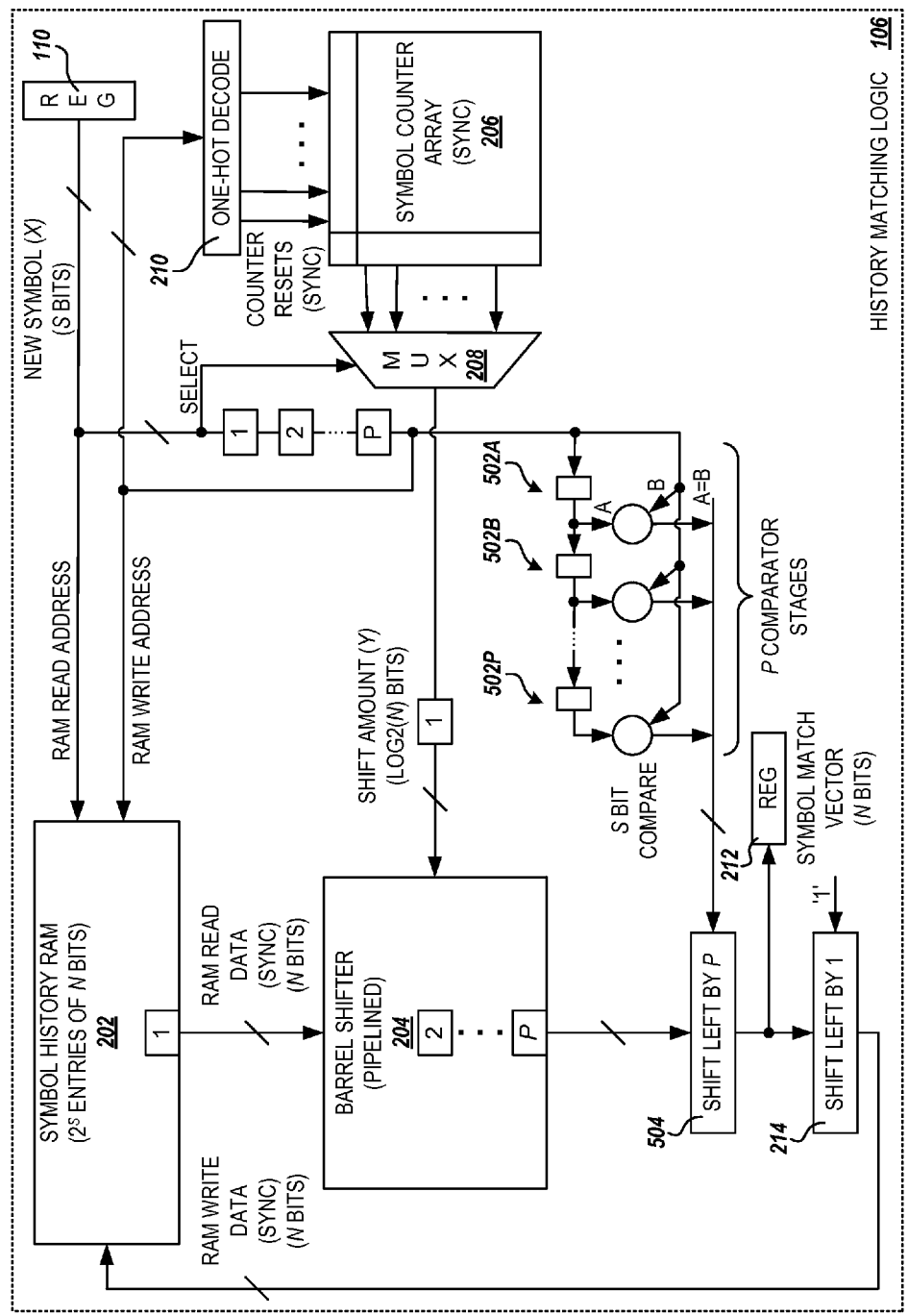
FIG. 5 is a logic diagram showing additional illustrative logic for generating match data for a symbol in a symbol history utilizing a pipelined architecture, according to embodiments described herein.

It will be appreciated that history matching logic 106 shown in FIG. 2 is a simplified implementation that requires a RAM with asynchronous read capability and a single cycle loop from the input register 110 to the read of the symbol history RAM 202 and the counter selection MUX 208, to the barrel shifter 204, and to the write back to the symbol history RAM. In further embodiments, the various functional blocks may be configured with additional pipeline registers to improve clock performance. FIG. 5 shows one example of the history matching logic 106 with the key functional blocks containing pipelining registers. For example, the barrel shifter 204 may be implemented with a number of pipeline registers. Additional P comparator stages 502A-502P may also be implemented to compare the incoming symbol(s) to a small history to allow for pipeline delays in the symbol history RAM 202 and the barrel shifter 204, where the number P equals the number of pipeline registers in the barrel shifter 204+1.

A corresponding number pipeline registers is implemented between the new symbol in the input register 110 and the comparator stages 502A-502P, the write address to the symbol history RAM 202 and the one-hot decode 210 to match the barrel shift delay. The performance increase is proportional to the number of pipeline registers added to the barrel shifter 204. However, P is expected to be small as compared to N, such as on the order of 2-6 stages, according to some embodiments. It will be appreciated that other methods of pipelining known in the art may be implemented in the history matching logic 106 to increase clock performance of the circuit beyond those shown in FIG. 5 and described herein, and it is intended that all such implementations be included in the scope of this disclosure.

Figure 6:
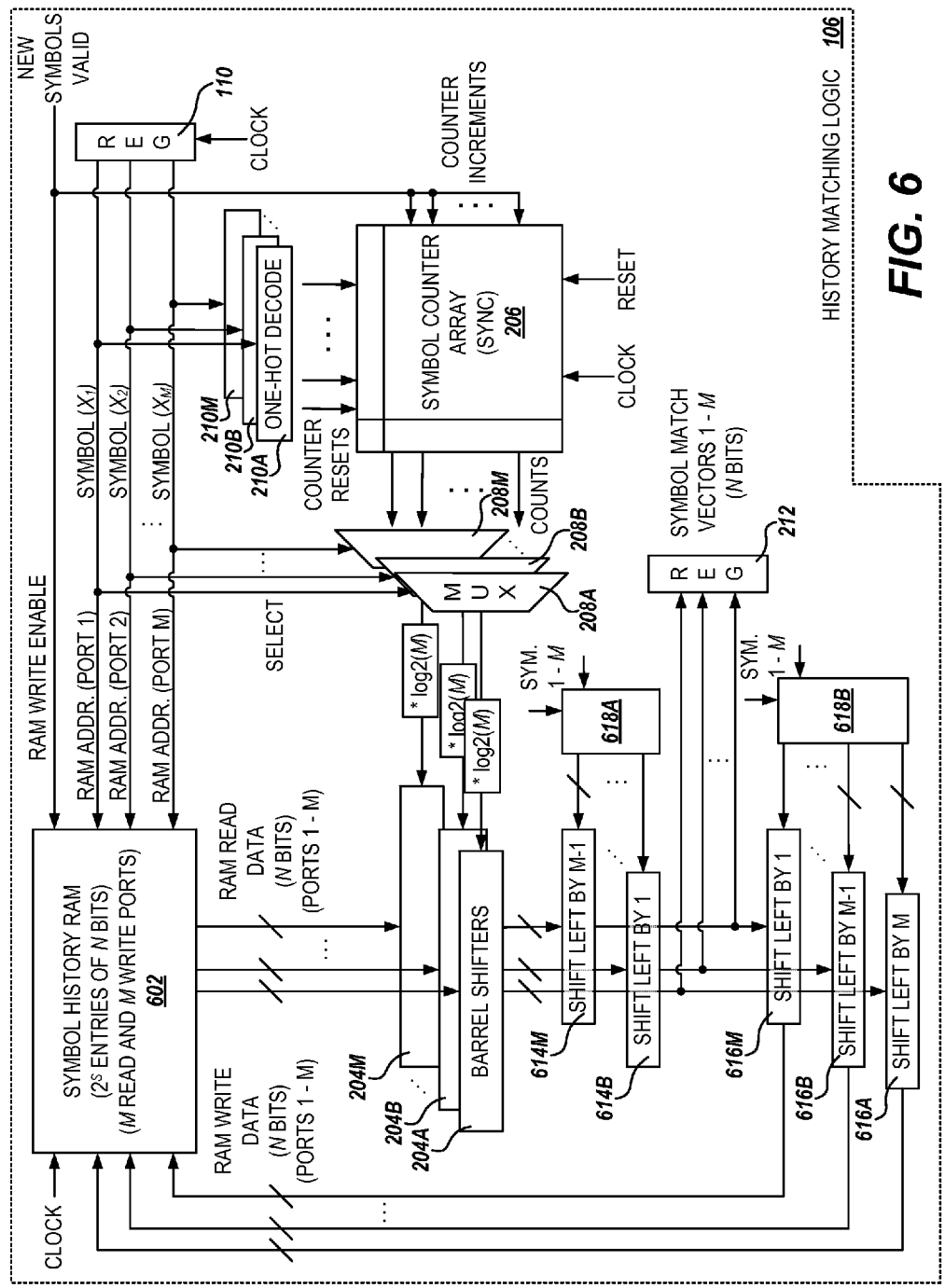
FIG. 6 is a logic diagram showing additional illustrative logic for generating match data for multiple symbols in a symbol history in a single clock cycle, according to embodiments described herein.

It will be further appreciated that the history matching logic 106 shown in FIG. 2 processes a single symbol (typically a single byte) per clock cycle. However, fundamental performance of the circuitry is not limited to one symbol per cycle and can be scaled to multiple symbols (bytes) per cycle. Additional components or features may be required to support multiple symbols per cycle. For example, FIG. 6 shows one example of the history matching logic 106 configured to process some number M of symbols per clock cycle. The symbol history matching logic 106 shown in FIG. 6 comprises a multi-ported symbol history RAM 602 with M read ports and M write ports, M barrel shifters 204A-204M, and M one-hot decoders 210A-210M. The counters in the symbol counter array 206 are configured to represent the number of M-symbol words observed between words without a given symbol.

At each new clock cycle, the input register 110 contains some number M of new symbols $X_1$-$X_M$, and the history matching logic 106 produces M sets of symbol match vectors in the output register 612. In some embodiments, the one-hot decoders 210A-210M are "ORed" together such that any occurrence of a given symbol in the symbols $X_1$-$X_M$ causes the corresponding counter in the symbol counter array 206 to be reset. A separate counter selection MUX 208A-208M is used for each symbol 1-M with the associated barrel shifter 204A-204M. The counter value selected by the counter selection MUX 208A-208M is multiplied by log 2(M) since each counter value represents a number of M-symbol words.

Symbol matches between the M symbols processed within the clock cycle are handled by small arrays of direct logic comparators, such as array A 618A and array B 618B. These arrays 618A and 618B directly compare all combinations of the M symbols with each other and selected compare outputs are shifted into the results from the barrel shifters 204A-204M in shift registers 614B-614M and 616A-616M to form the final symbol match vectors for output as well as the updated values for writing back to the multi-ported symbol history RAM 602. Tables 1 and 2 provide example logic arrays for the direct logic comparator arrays A 618A and B 618B, respectively, according to some embodiments.

TABLE 1

Array A

| Symbol J | Shift by | 1 | 2 | ... | M-1 | M |
|---|---|---|---|---|---|---|
|  |  |  | Shift IN Vector |  |  |  |
| M | M-1 | SymM = Sym1 | SymM = Sym2 | ... | SymM = SymM-1 |  |
| M-1 | M-2 | ... | ... | ... | ... | ... |
| 3 | 2 | Sym3 = Sym1 | Sym3 = Sym2 | ... |  |  |
| 2 | 1 | Sym2 = Sym1 |  | ... |  |  |
| 1 | 0 |  |  | ... |  |  |

TABLE 1-continued

Array A

| Symbol J | Shift by | 1 | 2 | ... | M-1 | M |
|---|---|---|---|---|---|---|
|  |  |  | Shift IN Vector |  |  |  |

TABLE 2

Array B

| Symbol J | Shift by | 1 | 2 | ... | M-1 | M |
|---|---|---|---|---|---|---|
|  |  |  |  | Shift IN Vector |  |  |
| M | 1 |  |  | ... |  | '1' |
| M-1 | 2 |  |  | ... | '1' | SymM-1 = SymM |
| ... | ... | ... | ... | ... | ... | ... |
| 3 | M-2 |  |  | ... | Sym3 = SymM-1 | Sym3 = SymM |
| 2 | M-1 |  | '1' | ... | Sym2 = SymM-1 | Sym2 = SymM |
| 1 | M | '1' | Sym1 = Sym2 | ... | Sym1 = SymM-1 | Sym1 = SymM |

For example, in a history matching logic 106 configured to process M=8 symbols per clock cycle, the arrays A 618A and B 618B may implement the logic shown below in tables 3 and 4. It will be appreciated that simultaneous writes to the same address location of the multi-ported symbol history RAM 602 will have identical data, therefore no particular priority mechanism is required and any input can be selected. However, since multi-ported RAMs generally cannot write different values to the same address, a priority mechanism may be implemented to select a unique input in the event of an address conflict, according to further embodiments

TABLE 3

Example Array A for M = 8

| Symbol J | Shift by | 1 | 2 | 3 | 4 | 5 | 6 | 7 | 8 |
|---|---|---|---|---|---|---|---|---|---|
|  |  |  |  |  | Shift IN Vector |  |  |  |  |
| 8 | 7 | Sym8 = Sym1 | Sym8 = Sym2 | Sym8 = Sym3 | Sym8 = Sym4 | Sym8 = Sym5 | Sym8 = Sym6 | Sym8 = Sym7 |  |
| 7 | 6 | Sym7 = Sym1 | Sym7 = Sym2 | Sym7 = Sym3 | Sym7 = Sym4 | Sym7 = Sym5 | Sym7 = Sym6 |  |  |
| 6 | 5 | Sym6 = Sym1 | Sym6 = Sym2 | Sym6 = Sym3 | Sym6 = Sym4 | Sym6 = Sym5 |  |  |  |
| 5 | 4 | Sym5 = Sym1 | Sym5 = Sym2 | Sym5 = Sym3 | Sym5 = Sym4 |  |  |  |  |
| 4 | 3 | Sym4 = Sym1 | Sym4 = Sym2 | Sym4 = Sym3 |  |  |  |  |  |
| 3 | 2 | Sym3 = Sym1 | Sym3 = Sym2 |  |  |  |  |  |  |
| 2 | 1 | Sym2 = Sym1 |  |  |  |  |  |  |  |
| 1 | 0 |  |  |  |  |  |  |  |  |

TABLE 4

Example Array B for M = 8

| Symbol J | Shift by | 1 | 2 | 3 | 4 | 5 | 6 | 7 | 8 |
|---|---|---|---|---|---|---|---|---|---|
|  |  |  |  |  | Shift IN Vector |  |  |  |  |
| 8 | 1 |  |  |  |  |  |  |  | '1' |
| 7 | 2 |  |  |  |  |  |  | '1' | Sym7 = Sym8 |
| 6 | 3 |  |  |  |  |  | '1' | Sym6 = Sym7 | Sym6 = Sym8 |

TABLE 4-continued

Example Array B for M = 8

| Symbol J | Shift by | Symbol K | | | | | | | |
|---|---|---|---|---|---|---|---|---|---|
| | | 1 | 2 | 3 | 4 | 5 | 6 | 7 | 8 |
| | | | | | | Shift IN Vector | | | |
| 5 | 4 | | | | | '1' | Sym5 = Sym6 | Sym5 = Sym7 | Sym5 = Sym8 |
| 4 | 5 | | | | '1' | Sym4 = Sym5 | Sym4 = Sym6 | Sym4 = Sym7 | Sym4 = Sym8 |
| 3 | 6 | | | '1' | Sym3 = Sym4 | Sym3 = Sym5 | Sym3 = Sym6 | Sym3 = Sym7 | Sym3 = Sym8 |
| 2 | 7 | | '1' | Sym2 = Sym3 | Sym2 = Sym4 | Sym2 = Sym5 | Sym2 = Sym6 | Sym2 = Sym7 | Sym2 = Sym8 |
| 1 | 8 | '1' | Sym1 = Sym2 | Sym1 = Sym3 | Sym1 = Sym4 | Sym1 = Sym5 | Sym1 = Sym6 | Sym1 = Sym7 | Sym1 = Sym8 |

Based on the foregoing, it will be appreciated that methods and apparatuses for generating match data for a symbol in a symbol history for use in a hardware-based data compressor are presented herein. The above-described embodiments are merely possible examples of implementations, merely set forth for a clear understanding of the principles of the present disclosure.

It will be appreciated that the structure and/or organization of the components of the history matching logic 106 may be different from that illustrated in FIGS. 2, 5, and 6 and described herein. For example, the symbol history RAM 202, barrel shifter(s) 204, symbol counter array 206 and other components and circuitry of the history matching logic 106 may be integrated within a common integrated circuit package along with the pattern track logic 108 and encoder 104, or the components may be distributed among multiple integrated circuit packages. Similarly, the illustrated connection pathways are provided for purposes of illustration and not of limitation, and some components and/or interconnections may be omitted for purposes of clarity. It will be further appreciated that the history matching logic 106 may not include all of the components shown in the figures, or may include other components that are not explicitly shown in the figures.

The logical steps, functions, or operations described herein as part of a method, process or routine may be implemented (1) as interconnected digital circuits or components and/or (2) as a sequence of processor-implemented acts, software modules, or portions of code running on a controller or computing system. The implementation is a matter of choice dependent on the performance and other requirements of the system. Alternate implementations are included in which operations, functions or steps may not be included or executed at all, may be executed out of order from that shown or discussed, including substantially concurrently or in reverse order, depending on the functionality involved, as would be understood by those reasonably skilled in the art of the present disclosure.

It will be further appreciated that conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

Many variations and modifications may be made to the above-described embodiments without departing substantially from the spirit and principles of the present disclosure. Further, the scope of the present disclosure is intended to cover any and all combinations and sub-combinations of all elements, features, and aspects discussed above. All such modifications and variations are intended to be included herein within the scope of the present disclosure, and all possible claims to individual aspects or combinations of elements or steps are intended to be supported by the present disclosure.

What is claimed is:

1. An apparatus for performing history matching for a Lempel-Ziv ("LZ") compression scheme, the apparatus comprising:
    a symbol history random access memory ("RAM") comprising $2^S$ entries of N bits, each entry corresponding to a unique symbol value represented by S bits, the entry indicating locations within the last N symbols of input data where the unique symbol value occurred;
    a symbol counter array comprising $2^S$ counters, each counter corresponding to a unique symbol value and indicating a number of symbols processed since a last occurrence of the unique symbol value in the input data; and
    a barrel shifter configured to shift a first entry corresponding to a first symbol value from the symbol history RAM left by a number of bits based on a value of a counter corresponding to the first symbol value from the symbol counter array to produce a symbol match vector for the first symbol.

2. The apparatus of claim 1, further comprising:
    a shift register configured to shift the symbol match vector left by one bit while introducing a '1' at the lowest bit position, the shifted symbol match vector written back to the first entry in the symbol history RAM.

3. The apparatus of claim 1, further comprising a counter selection multiplexer configured to select the value of the counter corresponding to the first symbol value from the symbol counter array based on the first symbol value as selection input.

4. The apparatus of claim 1, the apparatus further configured to, upon processing the first symbol, increment each counter of the symbol counter array except for the counter corresponding to the first symbol value, the counter corresponding to the first symbol value being reset to zero.

5. The apparatus of claim 1, further comprising a one-hot decoder configured to effect reset of the counter corresponding to the first symbol value in the symbol counter array based on the first symbol value as input.

6. The apparatus of claim 1, wherein the barrel shifter comprises a first number of pipelining registers, the apparatus further comprising a second number of comparator stages, the second number related to the first number.

7. The apparatus of claim 1, wherein the symbol history RAM, the symbol counter array, and the barrel shifter are implemented in a same field-programmable gate array ("FPGA").

8. The apparatus of claim 1, wherein the symbol history RAM, the symbol counter array, and the barrel shifter are implemented in a same application-specific integrated circuit ("ASIC") containing an LZ class data compressor.

9. The apparatus of claim 1, wherein the symbol history RAM comprises a multi-ported RAM and further comprising a plurality of barrel shifters, the apparatus configured to process multiple symbols per clock cycle.

10. The apparatus of claim 1, wherein the apparatus is implemented in a controller of a mass storage device.

11. A method of producing symbol matches from a symbol history RAM for an input symbol, the method comprising steps of:
receiving the input symbol from an input data stream;
reading an entry from the symbol history RAM corresponding to the input symbol value, the entry comprising N bits indicating locations within the last N symbols from the input data stream where the input symbol value occurred; and
shifting the entry left a number of bits based on a value of a counter corresponding to the input symbol value to produce a symbol match vector for the input symbol, the value of the counter indicating a number of symbols processed since a last occurrence of the input symbol value in the input data stream.

12. The method of claim 11, further comprising steps of:
shifting the symbol match vector left by one bit while introducing a '1' at the lowest bit position; and
writing the shifted symbol match vector back to the entry in the symbol history RAM.

13. The method of claim 11, further comprising the step of:
upon producing the symbol match vector, resetting the counter corresponding to the input symbol value to zero.

14. The method of claim 11, wherein the counter corresponding to the input symbol value is contained in a symbol counter array comprising a counter corresponding to each possible symbol value and indicating a number of symbols processed since a last occurrence of the symbol value in the input data stream, and wherein the value of the counter corresponding to the input symbol value is selected from the symbol counter array by a counter selection multiplexer with the input symbol as selection input.

15. The method of claim 14, further comprising the step of:
upon producing the symbol match vector, incrementing a value of each counter of the symbol counter array by 1.

16. A system comprising:
an encoder configured to compress an input data stream based on an a Lempel-Ziv ("LZ") compression scheme;
pattern tracking logic configured to determine a location and length of matching sequences in symbol history based on symbol match vectors for each symbol in the input data stream; and
history matching logic configured to
receive an input symbol from the input data stream,
read an entry from a symbol history random access memory ("RAM") corresponding to the input symbol value, the entry comprising N bits indicating locations within the last N symbols from the input data stream where the input symbol value occurred, and
shift the entry left a number of bits based on a value of a counter corresponding to the input symbol value to produce a symbol match vector for the input symbol.

17. The system of claim 16, wherein the history matching logic comprises:
the symbol history RAM comprising $2^S$ entries of N bits, each entry corresponding to a unique symbol value of length S bits;
a symbol counter array comprising $2^S$ counters, each counter corresponding to a unique symbol value and indicating a number of symbols from the input data stream processed since a last occurrence of the unique symbol value; and
a barrel shifter configured to shift the entry left by the number of bits based on the value of the counter corresponding to the input symbol value.

18. The system of claim 17, wherein the history matching logic further comprises a counter selection multiplexer configured to select the value of the counter corresponding to the input symbol value from the symbol counter array based on the input symbol value as selection input.

19. The system of claim 17, wherein the history matching logic is further configured to, upon processing the input symbol, increment each counter of the symbol counter array except for the counter corresponding to the input symbol value, the counter corresponding to the input symbol value being reset to zero.

20. The system of claim 16, wherein the history matching logic is further configured to:
shift the symbol match vector for the input symbol left by one bit while introducing a '1' at the lowest bit position; and
write the shifted symbol match vector back to the entry in the symbol history RAM.

* * * * *